(12) United States Patent
Jing et al.

(10) Patent No.: US 12,014,058 B2
(45) Date of Patent: Jun. 18, 2024

(54) STACKED MEMORY AND STORAGE SYSTEM

(71) Applicant: HUAWEI TECHNOLOGIES CO., LTD., Guangdong (CN)

(72) Inventors: Weiliang Jing, Shanghai (CN); Zhengbo Wang, Shenzhen (CN); Jingjie Cui, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 35 days.

(21) Appl. No.: 18/146,996

(22) Filed: Dec. 27, 2022

(65) Prior Publication Data

US 2023/0139599 A1 May 4, 2023

Related U.S. Application Data

(63) Continuation of application No. PCT/CN2020/098645, filed on Jun. 28, 2020.

(51) Int. Cl.
| | |
|---|---|
| G06F 3/06 | (2006.01) |
| G11C 5/02 | (2006.01) |
| G11C 5/04 | (2006.01) |
| G11C 5/06 | (2006.01) |

(52) U.S. Cl.
CPC .......... *G06F 3/0619* (2013.01); *G06F 3/0629* (2013.01); *G06F 3/0685* (2013.01); *G11C 5/025* (2013.01); *G11C 5/04* (2013.01); *G11C 5/063* (2013.01)

(58) Field of Classification Search
None
See application file for complete search history.

(56) References Cited

U.S. PATENT DOCUMENTS

| | | | |
|---|---|---|---|
| 6,881,994 B2 * | 4/2005 | Lee | H01L 29/8616 257/74 |
| 8,537,634 B2 | 9/2013 | Muralimanohar et al. | |
| 8,582,373 B2 | 11/2013 | Hollis | |
| 9,535,831 B2 | 1/2017 | Jayasena et al. | |

(Continued)

FOREIGN PATENT DOCUMENTS

| | | |
|---|---|---|
| CN | 109148398 A | 1/2019 |
| CN | 111326194 A | 6/2020 |

OTHER PUBLICATIONS

Challenges of High-Capacity DRAM stacks and potential directions, AMD advanced research Nov. 12, 2018, 19 pages.

(Continued)

*Primary Examiner* — Kaushikkumar M Patel
(74) *Attorney, Agent, or Firm* — HUAWEI TECHNOLOGIES CO., LTD.

(57) ABSTRACT

A stacked memory includes a volatile memory die and a non-volatile memory die that are stacked together. The non-volatile memory die includes a non-volatile storage array and a peripheral circuit. The peripheral circuit includes a power integrity circuit and a signal integrity circuit. The power integrity circuit is configured to perform power integrity optimization on a power supply obtained from a lower-layer die and then transmit the power supply to an upper-layer die. The signal integrity circuit is configured to perform signal integrity optimization on a signal obtained from a lower-layer die and then transmit the signal to an upper-layer die.

20 Claims, 7 Drawing Sheets

(56) References Cited

U.S. PATENT DOCUMENTS

| | | | |
|---|---|---|---|
| 11,043,472 B1* | 6/2021 | Dokania | G11C 5/025 |
| 2012/0284541 A1* | 11/2012 | Dennard | H01L 23/642 |
| | | | 713/300 |
| 2015/0092490 A1 | 4/2015 | Miura et al. | |
| 2017/0154655 A1 | 6/2017 | Seo | |
| 2018/0005670 A1* | 1/2018 | Lee | G11C 7/1072 |
| 2019/0018468 A1* | 1/2019 | Kang | G11C 5/04 |
| 2020/0320243 A1* | 10/2020 | Hwang | H01L 25/0657 |
| 2020/0328195 A1* | 10/2020 | Fallin | H01L 28/40 |
| 2021/0081336 A1* | 3/2021 | Bradshaw | G11C 7/1075 |

OTHER PUBLICATIONS

DaVinCi: A Scalable Architecture for Neural Network Coputing, Heng Liao, HotChips Jul. 2019, 44 pages.
Expanding the Boundaries of the AI Revolution: An In-Depth Study of HBM, Hynix, Mar. 2019, 28 pages.

* cited by examiner

STACKED MEMORY AND STORAGE SYSTEM

CROSS-REFERENCE TO RELATED APPLICATIONS

This application is a continuation of International Application No. PCT/CN2020/098645, filed on Jun. 28, 2020, the disclosure of which is hereby incorporated by reference in its entirety.

TECHNICAL FIELD

This application relates to the field of memories, and in particular, to a stacked memory and a storage system.

BACKGROUND

To increase storage space of a single memory, a plurality of layers of memory dies may be stacked into a stacked memory. A quantity of stacked memory dies in the stacked memory also increases. However, due to a limitation of internal space of a mounted electronic device, a thickness of each layer of memory die becomes thinner. Consequently, reliability of the entire memory is reduced. When the quantity of stacked memory dies is large, power integrity and signal integrity of an upper-layer memory die may be reduced due to impact of a parasitic capacitor and a parasitic resistor. In the conventional technology, a circuit that improves the power integrity and the signal integrity separately occupies space of one layer of die, a height of the entire stacked memory is increased when the thickness of each layer of die remains unchanged, and the thickness of each layer of die is reduced when the height of the entire stacked memory remains unchanged. Consequently, the reliability is further reduced.

SUMMARY

Embodiments of this application provide a stacked memory and a storage system, to avoid reduction of power integrity and signal integrity of the stacked memory without increasing a quantity of dies.

To achieve the foregoing objectives, the following technical solutions are used in embodiments of this application.

According to a first aspect, a stacked memory is provided. The stacked memory includes a volatile memory die, a non-volatile memory die, and a control die that are stacked together. The non-volatile memory die includes a non-volatile storage array and a peripheral circuit. The peripheral circuit includes a power integrity circuit and a signal integrity circuit. The power integrity circuit is configured to perform power integrity optimization on a power supply obtained from a lower-layer die and then transmit the power supply to an upper-layer die; and the power integrity optimization includes at least one of filtering out voltage noise and reducing IR voltage drop. The signal integrity circuit is configured to perform signal integrity optimization on a signal obtained from a lower-layer die and then transmit the signal to an upper-layer die. The signal integrity optimization includes at least one of reducing common mode noise and impedance matching.

The stacked memory provided in this embodiment of this application includes the volatile memory die and the non-volatile memory die that are stacked together. The non-volatile memory die includes the non-volatile storage array and the peripheral circuit. The peripheral circuit includes the power integrity circuit and the signal integrity circuit. The power integrity circuit is configured to perform power integrity optimization on the power supply obtained from the lower-layer die and then transmit the power supply to the upper-layer die; and the signal integrity circuit is configured to perform signal integrity optimization on the signal obtained from the lower-layer die and then transmit the signal to the upper-layer die. The non-volatile storage array may be configured to store data, the peripheral circuit may be configured to improve power integrity and signal integrity between a bottom die and a top die of the stacked memory, and the peripheral circuit does not separately occupy one layer of die. Therefore, a quantity of dies is not increased while power integrity and signal integrity of the stacked memory are not reduced.

In a possible implementation, a control die is further stacked in the stacked memory, and the control die is configured to: control the peripheral circuit to store data in the volatile memory die to the non-volatile memory die; or control the peripheral circuit to store the data in the non-volatile memory die to the volatile memory die. The control die stores the data in the volatile memory die to the non-volatile memory die, to implement data backup; and the control die stores the data in the non-volatile memory die to the volatile memory die, to implement data recovery. Reliability of data storage is improved, and as data backup and recovery are implemented inside a chip, data transmission between chips is not required, so that energy consumption in a data backup and recovery process is reduced.

In a possible implementation, the control die is configured to: control the peripheral circuit to store the data in the volatile memory die to the non-volatile memory die when it is detected that a working power supply is turned off; and control the peripheral circuit to store the data in the non-volatile memory die to the volatile memory die when it is detected that the working power supply is restored to supply power. The stacked memory may be applied to power-off data backup.

In a possible implementation, the data is checkpoint data, and the control die is configured to: control the peripheral circuit to store the data in the volatile memory die to the non-volatile memory die when a checkpoint data backup command is received or a timing reaches a backup cycle; and control the peripheral circuit to store the data in the non-volatile memory die to the volatile memory die when a checkpoint data recovery command is received. That is, the stacked memory may be applied to checkpoint data backup.

In a possible implementation, when the checkpoint data backup command is received or the timing reaches the backup cycle, the control die is configured to: if an unused memory resource in the non-volatile memory die is greater than a threshold, store current checkpoint data to the unused memory resource of the non-volatile memory die; otherwise, overwrite earliest checkpoint data with the current checkpoint data. This implementation may ensure sufficient storage space to back up the checkpoint data.

In a possible implementation, the non-volatile storage array and the peripheral circuit are implemented on a same substrate of the non-volatile memory die. That is, the non-volatile storage array and the peripheral circuit are implemented in a two-dimensional planar structure on the same substrate of the non-volatile memory die.

In a possible implementation, the non-volatile storage array may include a first non-volatile storage array and a second non-volatile storage array, and the first non-volatile storage array and the second non-volatile storage array are respectively implemented on two sides of the peripheral circuit of a same layer. The non-volatile memory die is a symmetrical structure, and a delay difference between reading and writing, by the peripheral circuit, data stored in the two non-volatile storage arrays is small.

In a possible implementation, the non-volatile storage array and the peripheral circuit may be implemented at different layers of the non-volatile memory die. That is, the non-volatile storage array and the peripheral circuit are implemented in a three-dimensional stacked structure at different layers of the non-volatile memory die.

In a possible implementation, the non-volatile memory die further includes a substrate, a first metal layer group, and a second metal layer group. The peripheral circuit is implemented on the substrate, and the first metal layer group, the non-volatile storage array, the second metal layer group, and the substrate are sequentially stacked on different layers of the non-volatile memory die. That is, the non-volatile storage array and the peripheral circuit are implemented in a three-dimensional stacked structure at different layers of the non-volatile memory die.

In a possible implementation, a storage unit type of the non-volatile storage array includes a flash memory, a ferroelectric random access memory, a magnetic memory, a phase change random access memory, or a resistance switching random access memory.

In a possible implementation, the volatile memory die includes a first volatile memory die and a second volatile memory die, and the first volatile memory die, the non-volatile memory die, the second volatile memory die, and the control die are sequentially stacked.

In a possible implementation, the volatile memory die includes a first volatile memory die and a second volatile memory die, the non-volatile memory die includes a first non-volatile memory die and a second non-volatile memory die, and the first volatile memory die, the first non-volatile memory die, the second volatile memory die, and the second non-volatile memory die are stacked sequentially.

In a possible implementation, the volatile memory die, the non-volatile memory die, and the control die are sequentially stacked.

According to a second aspect, a storage system is provided. The storage system includes the stacked memory described in the first aspect and any one of the implementations of the first aspect, a working power supply, and a backup power supply. The stacked memory is powered by the working power supply during normal operation of the storage system; when the working power supply is turned off, the backup power supply supplies power to the stacked memory; and when the working power supply is restored to supply power, the working power supply supplies power to the stacked memory again.

For technical effects of the second aspect, refer to a technical effect of any one of the first aspect and the embodiment of the first aspect.

DESCRIPTION OF EMBODIMENTS

Figure 1:
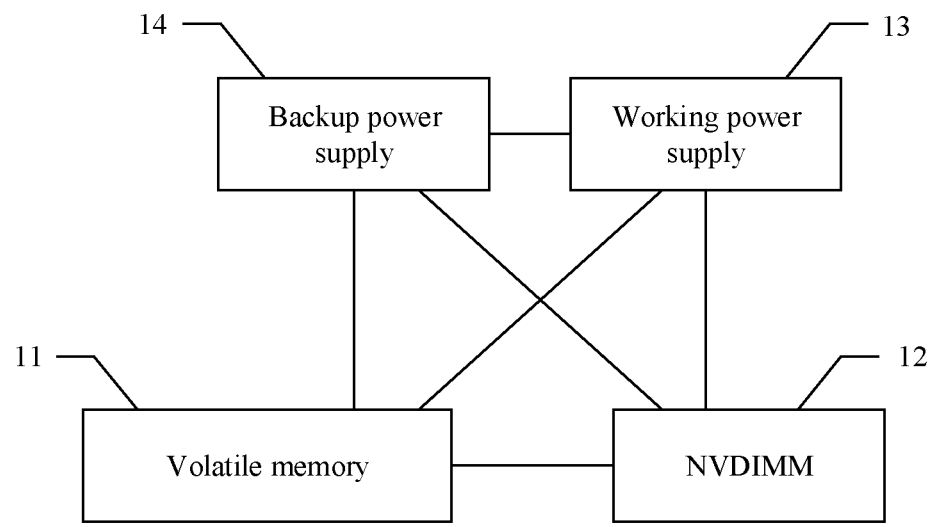
FIG. 1 is a schematic diagram of a structure of a storage system according to an embodiment of this application.

In addition, the word "example" in embodiments of this application is used to represent giving an example, an illustration, or a description. Any embodiment or design scheme described as an "example" in this application should not be explained as being more preferred or having more advantages than another embodiment or design scheme. Specifically, the term "example" is used to present a concept in a specific manner.

First, some concepts in embodiments of this application are described.

Signal integrity (SI): In a stacked memory, memory dies are stacked together by using a through silicon via (TSV) and/or bonding technology. Therefore, a parasitic capacitor and a parasitic resistor are generated. The signal integrity means that a signal can still meet a requirement of normal operation after being transmitted from a bottom die to an upper-layer die through a TSV and/or bonding. Signal integrity problems include, but are not limited to, an impedance matching problem (ringing or crosstalk) and common mode noise (a ground bounce or an IR voltage drop) in a process of signal transmission.

Power integrity (PI): In a stacked memory, the power integrity refers to that a power supply voltage can still meet a requirement of normal operation after being transmitted from a bottom die to an upper-layer die through a TSV and/or bonding. Power integrity problems include, but are not limited to, an IR voltage drop and voltage noise (for example, large noise introduced due to a current change when a DRAM is read and written) in a process of power supply voltage transmission.

Checkpoint means that a processor synchronizes a page on a memory and a page in a shared memory buffer at a time point.

The processor may be a chip. In this application, the processor may be a field-programmable gate array (FPGA), an application specific integrated circuit (ASIC), a system on chip (SoC), or a central processor unit (CPU), a network processor (NP), a digital signal processor (DSP), a micro controller unit (MCU), or a programmable logic device (PLD) or another integrated chip may be used.

A stacked memory is a memory formed by stacking a plurality of layers of memory dies, each layer of memory die includes a storage array formed by arranging a plurality of storage units.

A volatile memory refers to a memory in which stored data disappears when a power supply is turned off. A volatile memory in embodiments of this application includes: a dynamic random access memory (DRAM), a high-bandwidth memory (HBM), a hybrid memory cube (HMC), or the like.

A non-volatile memory refers to a memory in which stored data does not disappear when the power supply is turned off. A non-volatile memory is classified into a non-rewritable memory or a rewritable memory based on whether the memory is rewritable. The non-volatile memory in embodiments of this application refers to a rewritable memory, including a flash memory, a ferroelectric random access memory (FeRAM), a magnetic random access memory (MRAM), a phase change random access memory (PRAM), a resistance switching random access memory (ReRAM), or the like. In the FeRAM, a ferroelectric film capacitor replaces a conventional charge storage capacitor. Based on a high dielectric constant and a ferroelectric polarization characteristic of a ferroelectric material, the FeRAM stores data by using polarization inversion of the ferroelectric film capacitor. The MRAM stores data by using magnetic polarization rather than a charge. The PRAM stores data by using a conductivity difference displayed by a special material during conversion between a crystalline state and an amorphous state. The ReRAM stores data based on different resistance values.

An embodiment of this application provides a storage system based on a non-volatile dual inline memory module (NVDIMM), to improve data reliability of a stacked memory. As shown in FIG. 1, the storage system includes: a volatile memory 11, an NVDIMM 12, a working power supply 13, and a backup power supply 14. A memory in the NVDIMM 12 may be a stacked memory. The volatile memory 11 may include an HBM, an HMC, or the like.

The volatile memory 11 and the NVDIMM 12 are connected by using a bus. The volatile memory 11 and the NVDIMM 12 are powered by the working power supply 13 during normal operation of the entire storage system. When the working power supply 13 is turned off due to a fault or the like, the backup power supply 14 supplies power to the volatile memory 11 and the NVDIMM 12, and data stored in the volatile memory 11 is backed up in the NVDIMM 12. When the working power supply 13 is restored to supply power, the backup power supply 14 supplies power to the volatile memory 11 and the NVDIMM 12 again, and the data stored in the NVDIMM 12 is recovered to the volatile memory 11.

When the storage system performs data backup and data recovery, a large amount of energy is consumed because of data transmission between chips. Therefore, a high requirement is put forward for the backup power supply, costs are improved, and standby time of an electronic device is reduced.

Figure 2:
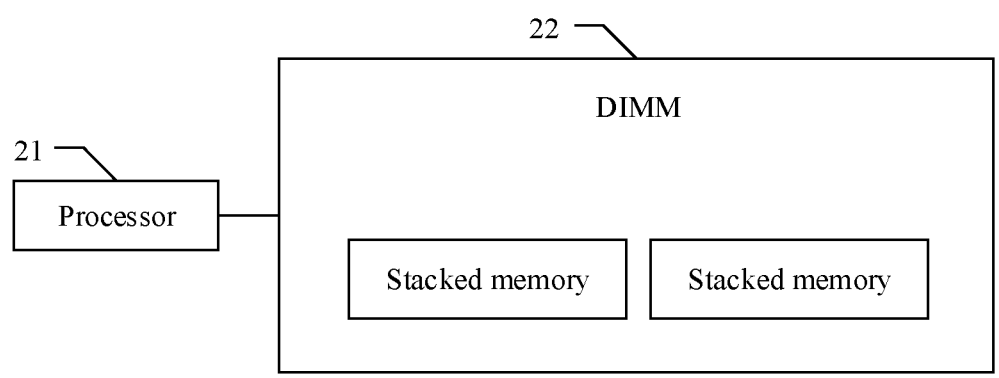
FIG. 2 is a schematic diagram of a structure of another storage system according to an embodiment of this application.

An embodiment of this application provides another storage system, to implement backup and recovery of checkpoint data. As shown in FIG. 2, the storage system includes: a processor 21 and a dual inline memory module (DIMM) 22.

When running a program, the processor 21 periodically backs up the checkpoint data to a stacked memory of the DIMM 22 by using a double data rate (DDR) bus, and when an error occurs in program running, the checkpoint data stored in the stacked memory of the DIMM 22 is recovered to the processor 21, to prevent the processor 21 from crashing when the processor runs the program for a long time. However, when the storage system backs up and recovers the checkpoint data, a large amount of energy is also consumed because of data transmission between chips.

In addition, as an electronic device requires more storage space, a quantity of stacked memory dies in the stacked memory also increases. However, due to a limitation of internal space of a mounted electronic device, a thickness of each layer of memory die becomes thinner. Consequently, reliability of the entire memory is reduced. For example, an excessively thin memory chip is easy to break, data retention time is reduced, and power integrity and signal integrity are reduced when the quantity of stacked memory dies is large. An embodiment of this application provides a stacked memory, to prevent power integrity and signal integrity from being reduced.

Figure 3:
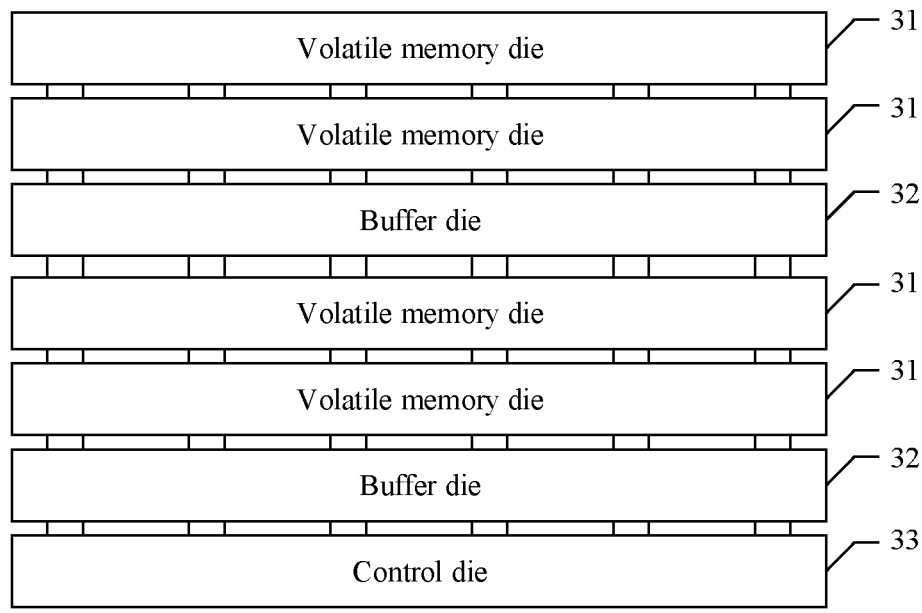
FIG. 3 is a schematic diagram 1 of a structure of a stacked memory according to an embodiment of this application.

An embodiment of this application provides a stacked memory, to improve power integrity and signal integrity of the stacked memory. As shown in FIG. 3, the stacked memory includes at least one volatile memory die 31, at least one buffer die 32, and a control die 33. The volatile memory die 31, the buffer die 32, and the control die 33 are stacked together by using a through silicon via (TSV) and/or bonding technology.

The control die 33 is configured to control a read/write operation performed on each volatile memory die 31. The buffer die 32 is not configured to store data, but integrates a decoupling capacitor, an amplifier, and the like, to improve power integrity and signal integrity for data transmission between the control die 33 and the volatile memory die 31.

However, in the stacked memory, the buffer die 32 separately occupies space of one layer of die, a height of the entire stacked memory is increased when the thickness of each layer of die remains unchanged, and the thickness of each layer of die is reduced when the height of the entire stacked memory remains unchanged. Consequently, reliability is further reduced.

An embodiment of this application provides another storage system. The storage system includes a stacked memory, and the stacked memory includes a non-volatile memory die and a volatile memory die that are stacked. A circuit for improving signal integrity and power integrity is implemented in a peripheral circuit of the non-volatile memory die without occupying an additional memory die. In addition, data transmission may be performed between the non-volatile memory die and the volatile memory die, data backup and data recovery can be implemented through data transmission inside a chip, to reduce energy consumption, and reduce a requirement for a backup power supply. Therefore, costs may be reduced and standby time of an electronic device may be prolonged.

Figure 4:
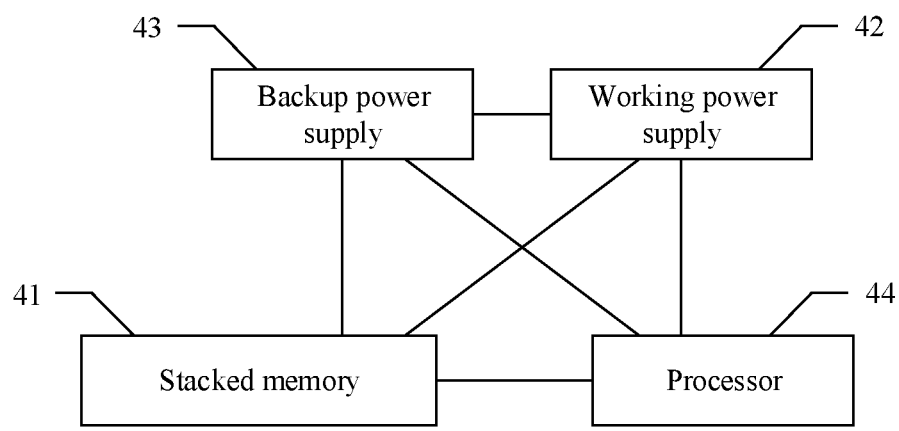
FIG. 4 is a schematic diagram of a structure of still another storage system according to an embodiment of this application.

As shown in FIG. 4, the storage system includes a stacked memory 41, a working power supply 42, a backup power supply 43, and optionally, may further include a processor 44.

The stacked memory 41 and the processor 44 is powered by the working power supply 42 during normal operation of the entire storage system. When the working power supply 42 is turned off due to a fault or the like, the backup power supply 43 supplies power to the stacked memory 41 and the processor 44. When the working power supply 42 is restored to supply power, the working power supply 42 supplies power to the stacked memory 41 and the processor 44 again.

Figure 5:
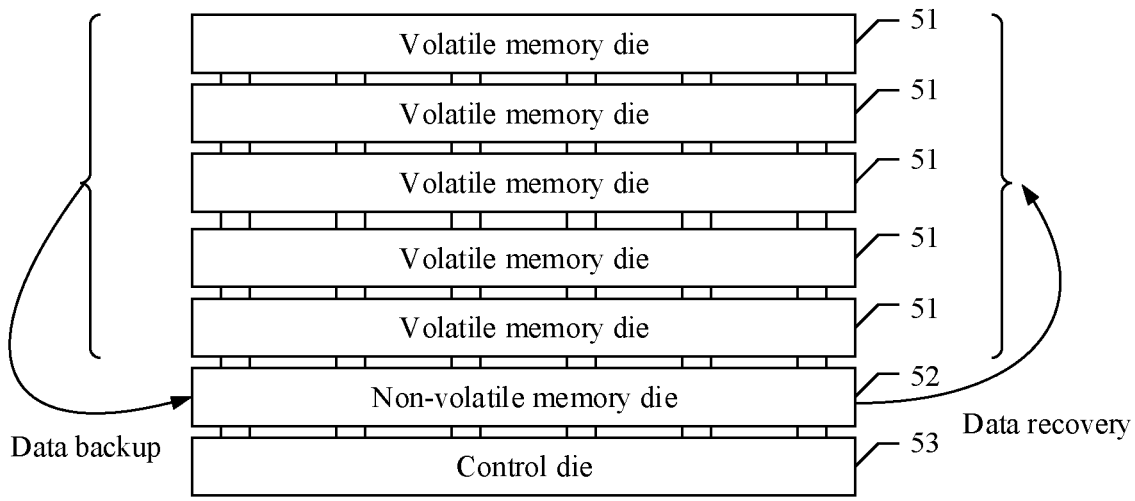
FIG. 5 is a schematic diagram 2 of a structure of a stacked memory according to an embodiment of this application.
Figure 6:
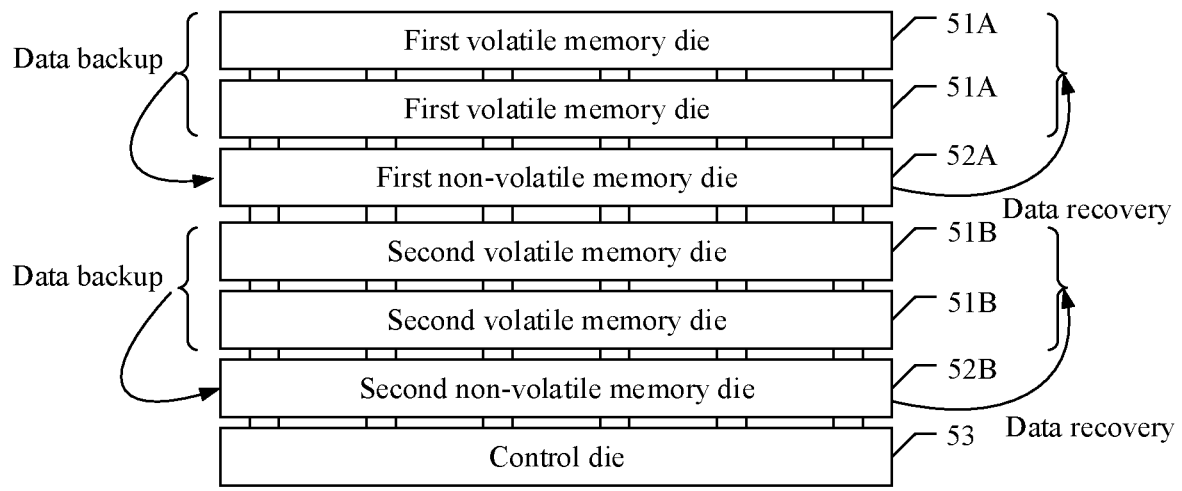
FIG. 6 is a schematic diagram 3 of a structure of a stacked memory according to an embodiment of this application.
Figure 7:
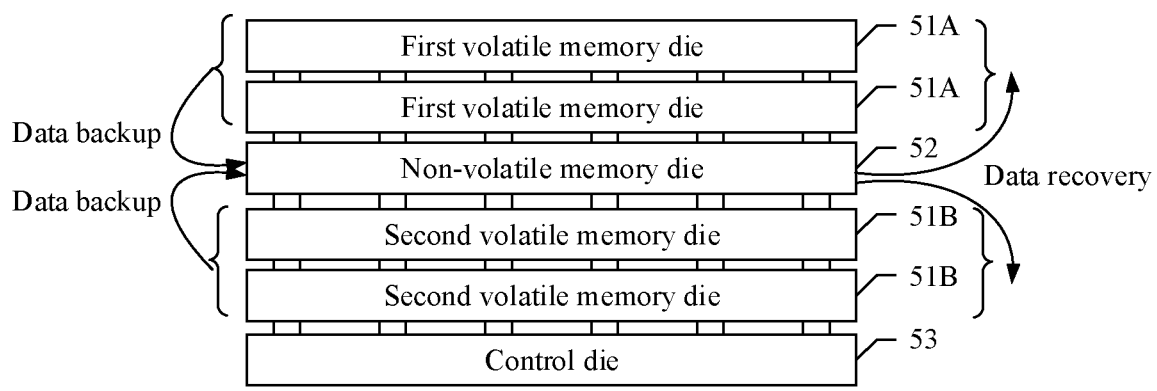
FIG. 7 is a schematic diagram 4 of a structure of a stacked memory according to an embodiment of this application.

As shown in FIG. 5 to FIG. 7, the stacked memory includes a volatile memory die 51, a non-volatile memory die 52, and a control die 53. The volatile memory die 51, the non-volatile memory die 52, and the control die 53 are stacked together by using a through silicon via (TSV) and/or bonding technology.

This application does not limit a stacked sequence of the volatile memory die 51, the non-volatile memory die 52, and the control die 53.

For example, as shown in FIG. 5, stacking may be performed in a sequence of the volatile memory die 51, the non-volatile memory die 52, and the control die 53.

Alternatively, as shown in FIG. 6, the volatile memory die 51 includes a first volatile memory die 51A and a second volatile memory die 51B, and the non-volatile memory die 52 includes a first non-volatile memory die 52A and a second non-volatile memory die 52B. The first volatile memory die 51A, the first non-volatile memory die 52A, the second volatile memory die 51B, and the second non-volatile memory die 52B are stacked sequentially, and then are stacked with the control die 53 sequentially. That is, the volatile memory die 51 and the non-volatile memory die 52 are stacked with each other at intervals, and then are stacked with the control die 53.

Alternatively, as shown in FIG. 7, the volatile memory die 51 includes the first volatile memory die 51A and the second volatile memory die 51B. The first volatile memory die 51A, the non-volatile memory die 52, and the second volatile memory die 51B are stacked sequentially, and then are stacked with the control die 53 sequentially. That is, the non-volatile memory die 52 is stacked between two volatile memory dies.

Figure 8:
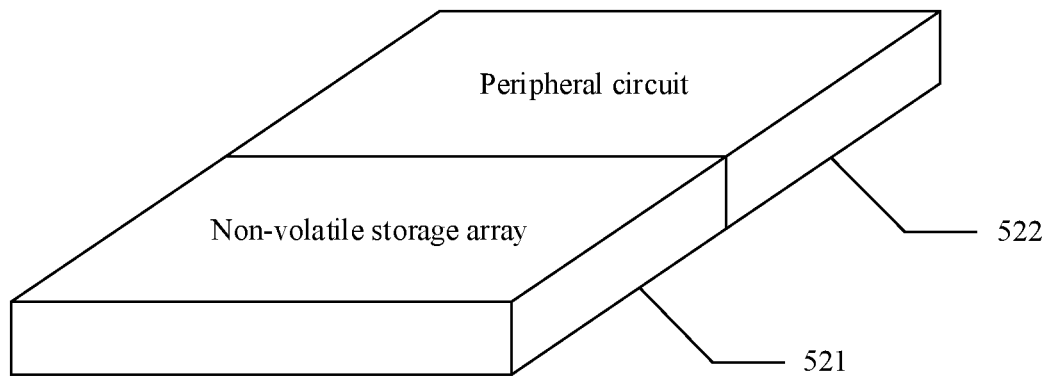
FIG. 8 is a schematic diagram of a structure of a non-volatile memory die according to an embodiment of this application.
Figure 9:
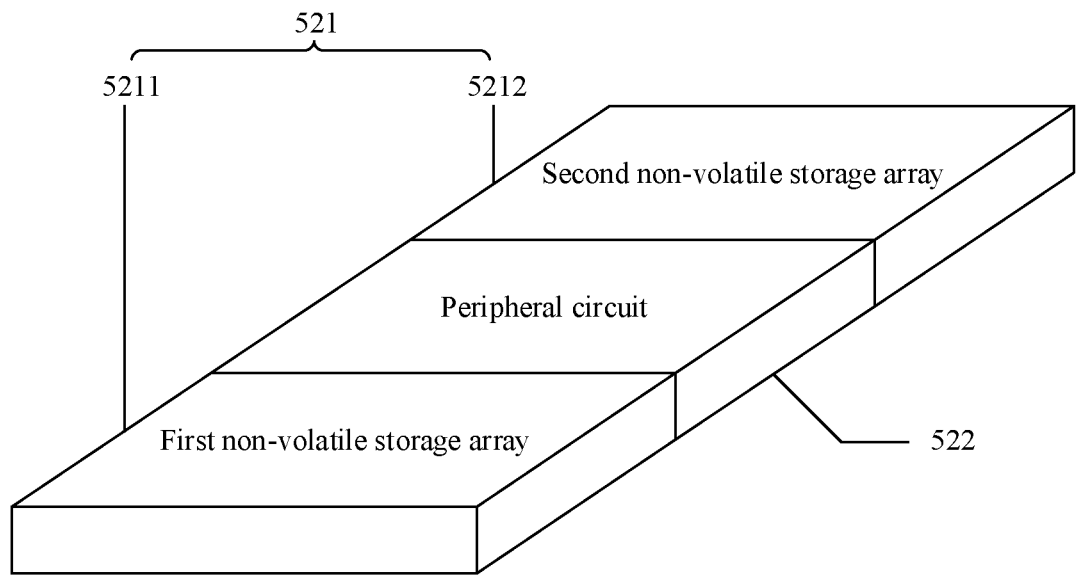
FIG. 9 is a schematic diagram of a structure of another non-volatile memory die according to an embodiment of this application.
Figure 10:
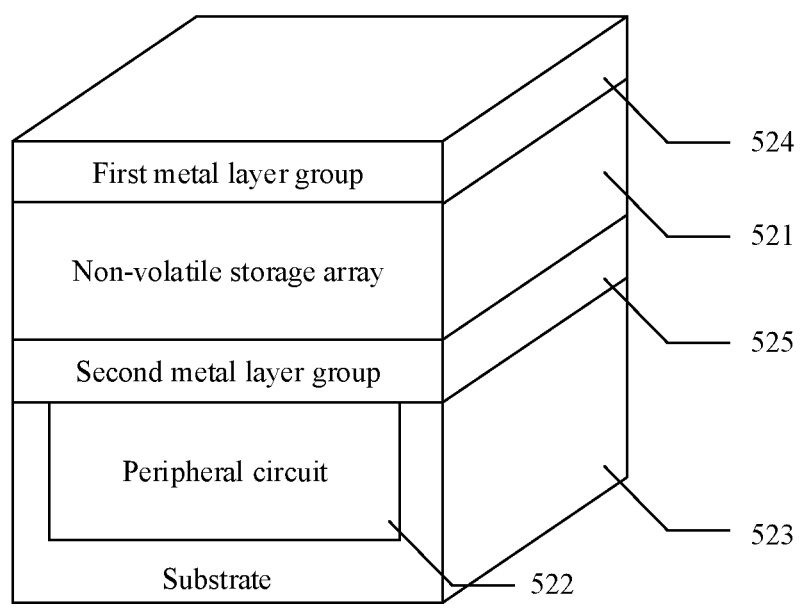
FIG. 10 is a schematic diagram of a structure of still another non-volatile memory die according to an embodiment of this application.

As shown in FIG. 8 to FIG. 10, the non-volatile memory die includes a non-volatile storage array 521 and a peripheral circuit 522.

The non-volatile storage array 521 includes a plurality of non-volatile storage units arranged sequentially.

The peripheral circuit 522 includes a read driver circuit, a write driver circuit, an erase driver circuit, a circuit of data judgment, and a circuit of instruction sending, and these circuits are configured to control reading and writing of data stored in the non-volatile storage array 521.

Figure 11:
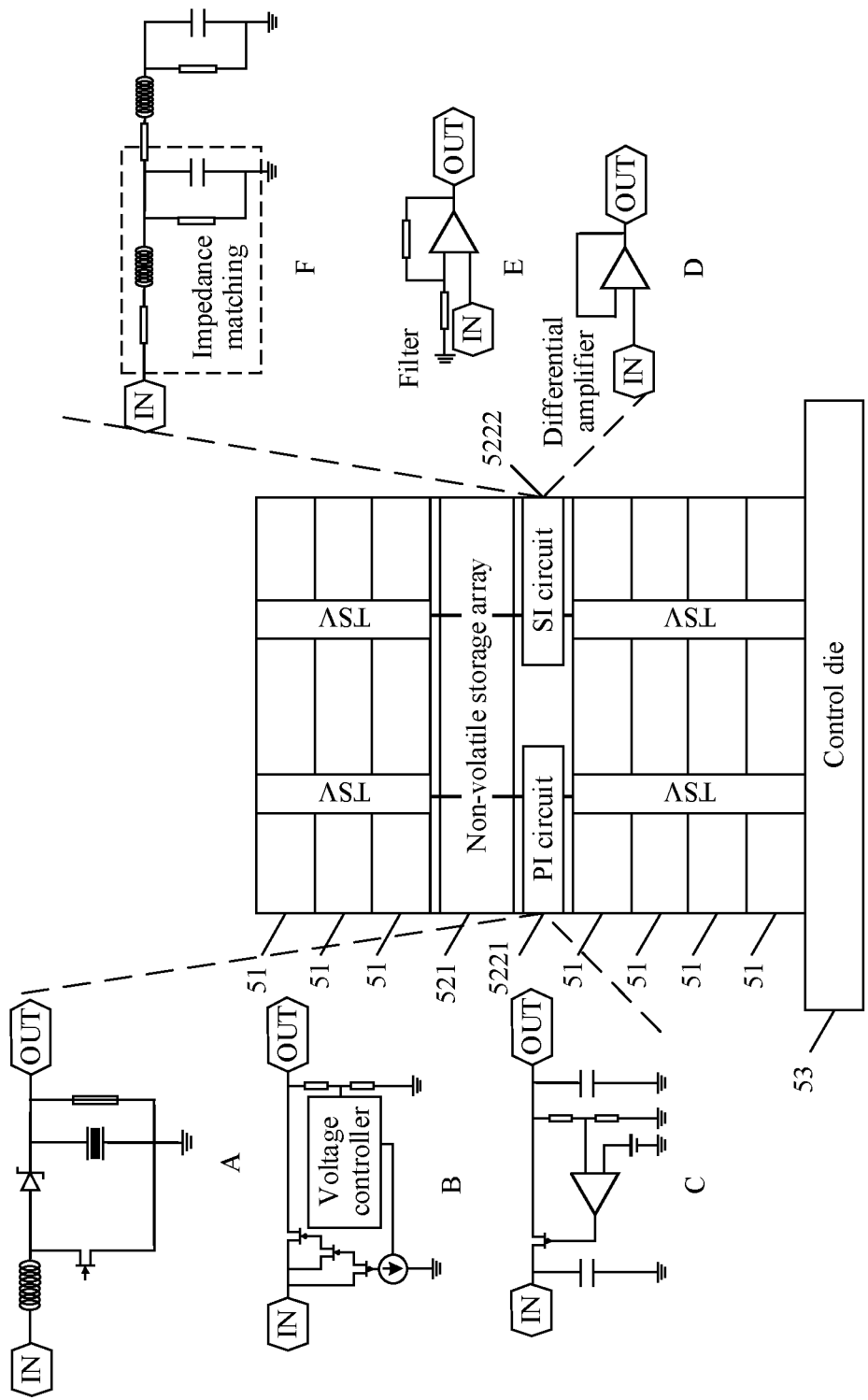
FIG. 11 is a schematic diagram of structures of a power integrity circuit and a signal integrity circuit according to an embodiment of this application.

As shown in FIG. 11, the peripheral circuit 522 further includes a power integrity (PI) circuit 5221 and a signal integrity (SI) circuit 5222. The PI circuit 5221 is configured to perform power integrity optimization on a power supply voltage obtained (for example, by using a TSV) from a lower-layer die (for example, a control die), and then transmit (for example, by using the TSV) the power supply voltage to an upper-layer die (for example, a volatile memory die), to improve power integrity between the lower-layer die and the upper-layer die of the stacked memory. The SI circuit is configured to perform signal integrity optimization on a signal obtained (for example, by using the TSV) from a lower-layer die, and then transmit (for example, by using the TSV) the signal to an upper-layer die, to improve signal integrity between the lower-layer die and the upper-layer die of the stacked memory.

The power integrity optimization includes, but is not limited to, at least one of filtering out voltage noise (for example, voltage boost circuits shown in A and B in FIG. 11) and reducing an IR drop (for example, a linear regulator shown in C in FIG. 11). The signal integrity optimization includes, but is not limited to, at least one of reducing common mode noise (for example, a differential amplifier shown in D in FIG. 11 and a filter shown in E in FIG. 11) and implementing impedance matching (for example, an impedance matching circuit shown in F in FIG. 11).

A production process of the non-volatile memory die includes a front end process and a back end process, and the front end process includes photoetching, etching machine processing, cleaning machine processing, ion implantation, chemical mechanical flattening, and the like. The back end process includes wire seating, bonder processing, flux copper backing (FCB) processing, ball grid array (BGA), checking, testing, and the like. The peripheral circuit can be implemented by using the front end process.

Compared with the stacked memory in FIG. 3, the peripheral circuit of the stacked memory in FIG. 5 can improve the power integrity and signal integrity of the stacked memory based on an existing control of reading and writing of data stored in the non-volatile storage array. That is, the circuit that improves the power integrity and the signal integrity is integrated into a non-volatile memory die, and does not separately occupy space of one layer of die. Therefore, the height of the stacked memory is not increased.

A stacking manner of the non-volatile storage array and the peripheral circuit is not limited in this application. In a possible implementation, as shown in FIG. 8 or FIG. 9, the non-volatile storage array 521 and the peripheral circuit 522 may be implemented on a same substrate of a non-volatile memory die. As shown in FIG. 9, the non-volatile storage array 521 may include a first non-volatile storage array 5211 and a second non-volatile storage array 5212. The first non-volatile storage array 5211 and the second non-volatile storage array 5212 may be respectively implemented on two sides of the peripheral circuit 522 of a same layer. It should be noted that a quantity of non-volatile storage arrays at a same layer is not limited in this embodiment of this application.

In another possible implementation, as shown in FIG. 10, the non-volatile storage array 521 and the peripheral circuit 522 may be implemented at different layers of a non-volatile memory die. For example, the non-volatile memory die further includes a substrate 523, a first metal layer group 524, and a second metal layer group 525. The peripheral circuit 522 is implemented on the substrate 523, and the first metal layer group 524, the non-volatile storage array 521, the second metal layer group 525, and the substrate 523 are sequentially stacked on different layers of the non-volatile memory die. The first metal layer group 524 and the second metal layer group 525 are configured to arrange routing within the non-volatile memory die.

A quantity of layers of the volatile memory die 51 is not limited in this application, and may be, for example, eight layers or 16 layers.

A storage unit type of the non-volatile storage array is not limited in this application. The storage unit type of the non-volatile storage array includes, but is not limited to, a flash memory, a FeRAM, an MRAM, a PRAM, or a ReRAM.

The control die 53 is configured to back up data in the volatile memory die 51 to the non-volatile memory die 52, or store data in the non-volatile memory die 52 to the volatile memory die 51.

In a possible implementation, when it is detected that the working power supply is turned off, the control die 53 controls the peripheral circuit 522 to store the data in the volatile memory die 51 to the non-volatile memory die 52. When it is detected that the working power supply is restored to supply power, the control die 53 controls the peripheral circuit 522 to store the data in the non-volatile memory die 52 to the volatile memory die 51.

For example, if the working power supply is suddenly turned off, a power supply detection module in the control die 53 or another power supply detection module detects a power-off event, the control die 53 enables the backup power supply to enter a power-off data backup mode, and the control die 53 stores a part or all of the data stored in the volatile memory die 51 to a first storage area in the non-volatile memory die 52, and the backup power supply may be turned off after completion of data storage. If the working power supply is restored to supply power, the power supply detection module in the control die 53 or another power supply detection module detects a power-off recovery event, and the control die 53 recovers and stores the data stored in the first storage area in the non-volatile memory die 52 to the volatile memory die 51.

In the power-off event, the storage system does not need to back up the data stored in the volatile memory to an external non-volatile memory; and in the power-off recovery event, the storage system does not need to store data backed up by the external non-volatile memory to the volatile memory. Data backup and recovery can be implemented within the stacked memory, to reduce energy consumption and reduce a requirement for the backup power supply. Therefore, costs are reduced.

In another possible implementation, the data is checkpoint data when the program is run, and when a checkpoint data backup command is received or a timing reaches a backup cycle, the control die 53 controls the peripheral circuit 522 to store data in the volatile memory die 51 to the non-volatile memory die 52. When receiving a checkpoint data recovery command, the control die 53 controls the peripheral circuit 522 to store the data in the non-volatile memory die 52 to the volatile memory die 51.

Figure 12:
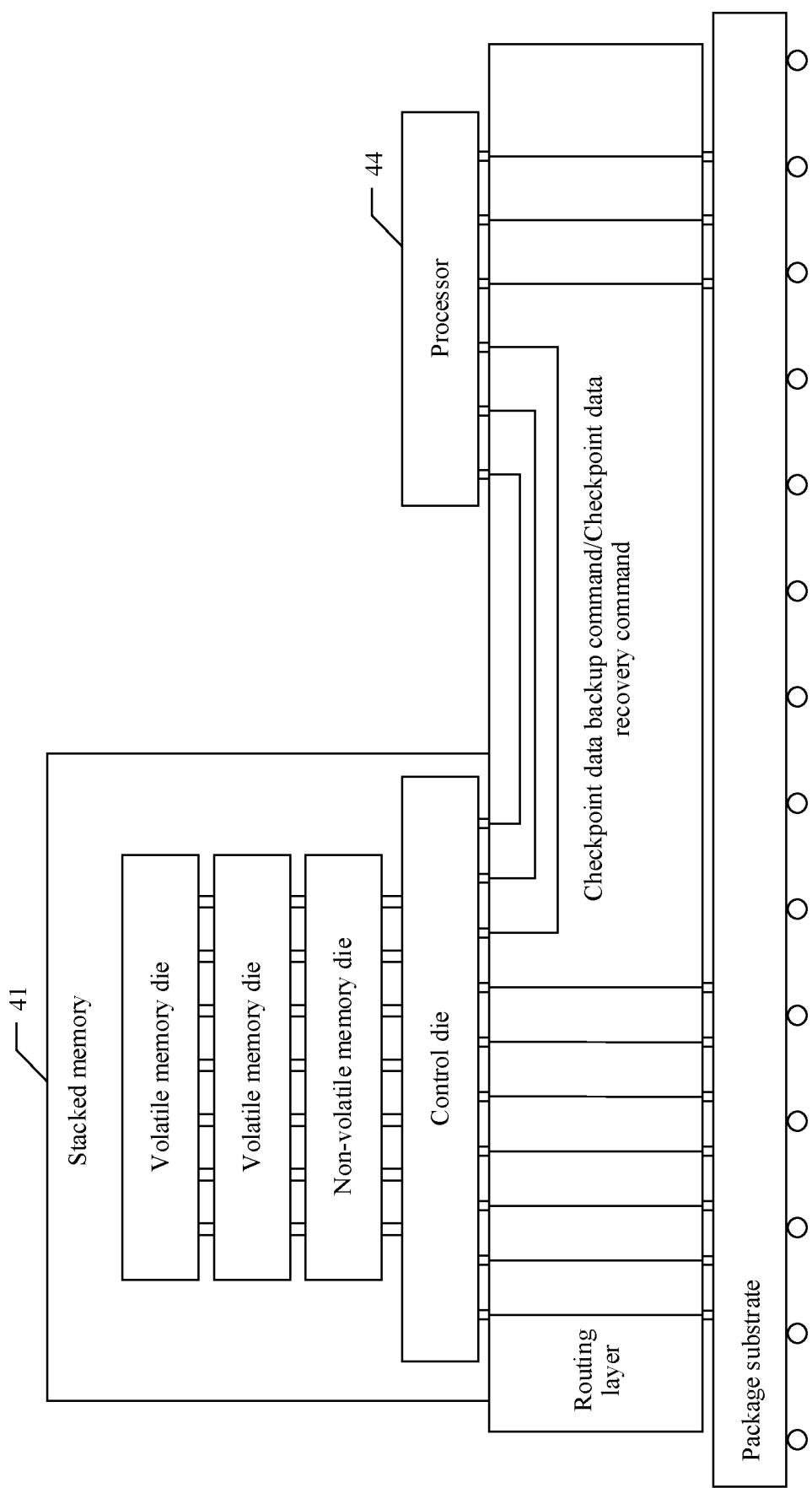
FIG. 12 is a schematic diagram of package of a stacked memory and a processor according to an embodiment of this application.

For example, as shown in FIG. 12, the stacked memory 41 and the processor 44 may be packaged on a package substrate, the stacked memory 41 and the processor 44 are electrically connected through a bus in a routing layer, and the stacked memory 41 and the processor 44 are separately electrically connected to the package substrate through the routing layer.

The processor periodically sends a checkpoint data backup command to the control die 53 of the stacked memory based on a backup cycle, and after receiving the checkpoint data backup command, the control die 53 backs up the checkpoint data stored in the volatile memory die 51 to a second storage area of the non-volatile memory die 52 based on a parameter in the checkpoint data backup command. That is, the control die 53 backs up the checkpoint data according to an instruction of the processor. Alternatively, when the timing reaches the backup cycle, the control die 53 backs up the checkpoint data stored in the volatile memory die 51 to the second storage area of the non-volatile memory die 52. That is, the control die 53 can autonomously back up the checkpoint data.

When a program crash occurs, the processor sends a checkpoint data recovery command to the control die 53 of the stacked memory, and after receiving the checkpoint data recovery command, the control die 53 recovers latest checkpoint data stored in the second storage area of the non-volatile memory die 52 to the volatile memory die 51 based on a parameter in the checkpoint data recovery command.

When the checkpoint data is periodically backed up, the storage system does not need to back up the checkpoint data stored in the volatile memory to the external non-volatile memory; and when the checkpoint data is recovered, the storage system does not need to store the checkpoint data backed up by the external non-volatile memory to the volatile memory. Checkpoint data backup and recovery can be implemented within the stacked memory, so that energy consumption can be reduced.

The first storage area and the second storage area described above may be same or different areas, and when the first storage area and the second storage area are different areas, the storage system may simultaneously perform power-off data storage and recovery and checkpoint data storage and recovery.

When the checkpoint data backup command is received or the timing reaches the backup cycle, if an unused memory resource in the non-volatile memory die 52 is greater than a threshold, current checkpoint data is stored to the unused memory resource of the non-volatile memory die 52 without overwriting earliest checkpoint data. Otherwise, the earliest checkpoint data is overwritten with the current checkpoint data in a first input first output (FIFO) order.

In the method, original technical characteristics of the hybrid high-bandwidth memory are retained, an integration degree is high, implementation costs and difficulty are low, and integrity of a signal transmitted between a bottom control die and a top DRAM die and integrity of a power supply can still be ensured without increasing costs of a die, to ensure reliability of a three-dimensional memory chip with a large quantity of stacked memory dies.

In addition, the control die stores the data in the volatile memory die to the non-volatile memory die, to implement data backup; and the control die stores the data in the non-volatile memory die to the volatile memory die, to implement data recovery. Reliability of data storage is improved, and as data backup and recovery are implemented inside a chip, data transmission between chips is not required, so that energy consumption in a data backup and recovery process is reduced.

In conclusion, in the stacked memory and the storage system provided in embodiments of this application, the stacked memory includes a volatile memory die and a non-volatile memory die that are stacked together. The non-volatile memory die includes a non-volatile storage array and a peripheral circuit. The peripheral circuit includes a power integrity circuit and a signal integrity circuit. The power integrity circuit is configured to perform power integrity optimization on a power supply obtained from a lower-layer die, and then transmit the power supply to an upper-layer die; and the signal integrity circuit is configured to perform signal integrity optimization on a signal obtained from a lower-layer die, and then transmit the signal to an upper-layer die. The non-volatile storage array may be configured to store data, the peripheral circuit may be configured to improve power integrity and signal integrity between a bottom die and a top die of the stacked memory, and the peripheral circuit does not separately occupy one layer of die. Therefore, a quantity of dies is not increased while power integrity and signal integrity of the stacked memory are not reduced.

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, device, and method may be implemented in other manners. For example, the described device embodiment is merely an example. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the devices or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

In addition, functional units in embodiments of this application may be integrated into one processing unit, each of the units may exist alone physically, or two or more units may be integrated into one unit.

All or some of the foregoing embodiments may be implemented by using software, hardware, firmware, or any combination thereof. When a software program is used to implement the embodiments, all or some of the embodiments may be implemented in a form of a computer program product. The computer program product includes one or more computer instructions. When the computer program instructions are loaded and executed on a computer, the procedure or functions according to embodiments of this application are completely or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another web site, computer, server, or data center in a wired (for example, a coaxial cable, an optical fiber, or a digital subscriber line (DSL)) or wireless (for example, infrared, radio, or microwave) manner. The computer storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

The foregoing descriptions are merely implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A stacked memory, comprising:
   a volatile memory die; and
   a non-volatile memory die that is stacked with the volatile memory die, wherein the non-volatile memory die comprises:
   a non-volatile storage array; and
   a peripheral circuit, comprising:
      a power integrity circuit, configured to perform power integrity optimization on a power supply obtained from a lower-layer die and then transmit the power supply to an upper-layer die, wherein the power integrity optimization comprises at least one of filtering out voltage noise or reducing IR voltage drop; and
      a signal integrity circuit, configured to perform signal integrity optimization on a signal obtained from the lower-layer die and then transmit the signal to the upper-layer die, wherein the signal integrity optimization comprises at least one of reducing common mode noise or impedance matching.

2. The stacked memory according to claim 1, further comprising a control die, stacked in the stacked memory and configured to:
   control the peripheral circuit to store data in the volatile memory die to the non-volatile memory die; or/and
   control the peripheral circuit to store the data in the non-volatile memory die to the volatile memory die.

3. The stacked memory according to claim 2, wherein the control die is configured to:
   control the peripheral circuit to store the data in the volatile memory die to the non-volatile memory die when it is detected that a working power supply is turned off; or/and
   control the peripheral circuit to store the data in the non-volatile memory die to the volatile memory die when it is detected that the working power supply is restored to supply power.

4. The stacked memory according to claim 2, wherein the data is checkpoint data, and the control die is configured to:
   control the peripheral circuit to store the data in the volatile memory die to the non-volatile memory die when a checkpoint data backup command is received or a timing reaches a backup cycle; or/and
   control the peripheral circuit to store the data in the non-volatile memory die to the volatile memory die when a checkpoint data recovery command is received.

5. The stacked memory according to claim 4, wherein when the checkpoint data backup command is received or the timing reaches the backup cycle, the control die is configured to:
   store current checkpoint data to the unused memory resource of the non-volatile memory die, wherein an unused memory resource in the non-volatile memory die is greater than a threshold; or/and
   overwrite earliest checkpoint data with the current checkpoint data, wherein an unused memory resource in the non-volatile memory die is equal to or less than the threshold.

6. The stacked memory according to claim 1, wherein the non-volatile storage array and the peripheral circuit are implemented on a same substrate of the non-volatile memory die.

7. The stacked memory according to claim 6, wherein the non-volatile storage array comprises:
   a first non-volatile storage array; and a second non-volatile storage array, wherein the first non-volatile storage array and the second non-volatile storage array are respectively implemented on two sides of the peripheral circuit of a same layer.

8. The stacked memory according to claim 1, wherein the non-volatile storage array and the peripheral circuit are implemented at different layers of the non-volatile memory die.

9. The stacked memory according to claim 8, wherein the non-volatile memory die further comprises:
   a substrate, wherein the peripheral circuit is implemented on the substrate;
   a first metal layer group; and
   a second metal layer group, wherein the first metal layer group, the non-volatile storage array, the second metal layer group, and the substrate are sequentially stacked on different layers of the non-volatile memory die.

10. The stacked memory according to claim 1, wherein a storage unit type of the non-volatile storage array comprises a flash memory, a ferroelectric random access memory, a magnetic memory, a phase change random access memory, or a resistance switching random access memory.

11. The stacked memory according to claim 1, wherein the volatile memory die comprises a first volatile memory die and a second volatile memory die, and the first volatile memory die, the non-volatile memory die, and the second volatile memory die are sequentially stacked.

12. The stacked memory according to claim 1, wherein the volatile memory die comprises a first volatile memory die and a second volatile memory die, the non-volatile memory die comprises a first non-volatile memory die and a second non-volatile memory die, and the first volatile memory die, the first non-volatile memory die, the second volatile memory die, and the second non-volatile memory die are stacked sequentially.

13. A storage system, comprising:
   a working power supply;
   a backup power supply, and
   a stacked memory, powered by the working power supply or the backup power supply, wherein the stacked memory comprises:
     a volatile memory die; and
     a non-volatile memory die that is stacked with the volatile memory die, wherein the non-volatile memory die comprises:
       a non-volatile storage array; and
       a peripheral circuit, comprising:
         a power integrity circuit, configured to perform power integrity optimization on a power supply obtained from a lower-layer die and then transmit the power supply to an upper-layer die, wherein the power integrity optimization comprises at least one of filtering out voltage noise or reducing IR voltage drop; and
         a signal integrity circuit, configured to perform signal integrity optimization on a signal obtained from the lower-layer die and then transmit the signal to the upper-layer die, wherein the signal integrity optimization comprises at least one of reducing common mode noise or impedance matching.

14. The stacked memory according to claim 13, further comprises:
   a control die, stacked in the stacked memory and configured to:
   control the peripheral circuit to store data in the volatile memory die to the non-volatile memory die; or/and
   control the peripheral circuit to store the data in the non-volatile memory die to the volatile memory die.

15. The stacked memory according to claim 14, wherein the control die is configured to:
   control the peripheral circuit to store the data in the volatile memory die to the non-volatile memory die when it is detected that a working power supply is turned off; or/and
   control the peripheral circuit to store the data in the non-volatile memory die to the volatile memory die when it is detected that the working power supply is restored to supply power.

16. The stacked memory according to claim 14, wherein the data is checkpoint data, and the control die is configured to:
   control the peripheral circuit to store the data in the volatile memory die to the non-volatile memory die when a checkpoint data backup command is received or a timing reaches a backup cycle; or/and
   control the peripheral circuit to store the data in the non-volatile memory die to the volatile memory die when a checkpoint data recovery command is received.

17. The stacked memory according to claim 16, wherein when the checkpoint data backup command is received or the timing reaches the backup cycle, the control die is configured to:
   store current checkpoint data to the unused memory resource of the non-volatile memory die, wherein an unused memory resource in the non-volatile memory die is greater than a threshold; or/and
   overwrite earliest checkpoint data with the current checkpoint data, wherein an unused memory resource in the non-volatile memory die is equal to or less than the threshold.

18. The stacked memory according to claim 13, wherein the non-volatile storage array and the peripheral circuit are implemented on a same substrate of the non-volatile memory die.

19. The stacked memory according to claim 18, wherein the non-volatile storage array comprises:
   a first non-volatile storage array; and
   a second non-volatile storage array, wherein the first non-volatile storage array and the second non-volatile storage array are respectively implemented on two sides of the peripheral circuit of a same layer.

20. The stacked memory according to claim 13, wherein the non-volatile storage array and the peripheral circuit are implemented at different layers of the non-volatile memory die.

* * * * *